US012170087B1

(12) United States Patent
Hart et al.

(10) Patent No.: US 12,170,087 B1
(45) Date of Patent: Dec. 17, 2024

(54) ALTERING AUDIO TO IMPROVE AUTOMATIC SPEECH RECOGNITION

(71) Applicant: Amazon Technologies, Inc., Seattle, WA (US)

(72) Inventors: Gregory M. Hart, Mercer Island, WA (US); William Spencer Worley, III, Half Moon Bay, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/976,137

(22) Filed: Oct. 28, 2022

Related U.S. Application Data

(63) Continuation of application No. 16/510,060, filed on Jul. 12, 2019, now Pat. No. 11,488,591, which is a
(Continued)

(51) Int. Cl.
*G10L 15/22* (2006.01)
*G10L 15/20* (2006.01)
(Continued)

(52) U.S. Cl.
CPC .............. *G10L 15/22* (2013.01); *G10L 15/20* (2013.01); *G10L 17/00* (2013.01); *G11B 27/005* (2013.01);
(Continued)

(58) Field of Classification Search
CPC ... G10L 15/26; G10L 2015/223; G10L 15/22; G10L 15/20; G10L 7/00; H03G 3/22; H03G 5/02
(Continued)

(56) References Cited

U.S. PATENT DOCUMENTS 7,418,392 B1  8/2008  Mozer et al.
7,424,431 B2  9/2008  Greene et al.
(Continued)

FOREIGN PATENT DOCUMENTS

WO   WO2011088053   7/2011

OTHER PUBLICATIONS

Office Action for U.S. Appl. No. 16/510,060, mailed on Apr. 19, 2021, Hart, "Altering Audio to Improve Automatic Speech Recognition", 14 Pages.

(Continued)

*Primary Examiner* — Disler Paul
(74) *Attorney, Agent, or Firm* — Pierce Atwood LLP

(57) ABSTRACT

Techniques for altering audio being output by a voice-controlled device, or another device, to enable more accurate automatic speech recognition (ASR) by the voice-controlled device. For instance, a voice-controlled device may output audio within an environment using a speaker of the device. While outputting the audio, a microphone of the device may capture sound within the environment and may generate an audio signal based on the captured sound. The device may then analyze the audio signal to identify speech of a user within the signal, with the speech indicating that the user is going to provide a subsequent command to the device. Thereafter, the device may alter the output of the audio (e.g., attenuate the audio, pause the audio, switch from stereo to mono, etc.) to facilitate speech recognition of the user's subsequent command.

21 Claims, 3 Drawing Sheets

Related U.S. Application Data continuation of application No. 15/918,608, filed on Mar. 12, 2018, now Pat. No. 10,354,649, which is a continuation of application No. 14/994,926, filed on Jan. 13, 2016, now Pat. No. 9,916,830, which is a continuation of application No. 13/627,890, filed on Sep. 26, 2012, now Pat. No. 9,251,787.

(51) Int. Cl.

| | | |
|---|---|---|
| *G10L 17/00* | (2013.01) | |
| *G11B 27/00* | (2006.01) | |
| *H03G 3/32* | (2006.01) | |
| *H03G 5/02* | (2006.01) | |
| *H04R 3/12* | (2006.01) | |
| *G10L 15/26* | (2006.01) | |

(52) U.S. Cl.
CPC ............. *H03G 3/32* (2013.01); *H03G 5/02* (2013.01); *H04R 3/12* (2013.01); *G10L 2015/223* (2013.01); *G10L 15/26* (2013.01)

(58) Field of Classification Search
USPC .................................. 381/86, 104, 107, 110
See application file for complete search history.

(56) References Cited

U.S. PATENT DOCUMENTS

| | | | |
|---|---|---|---|
| 7,706,553 | B2 | 4/2010 | Brown |
| 7,720,683 | B1 | 5/2010 | Vermeulen et al. |
| 7,774,204 | B2 | 8/2010 | Mozer et al. |
| 8,194,865 | B2 | 6/2012 | Goldstein et al. |
| 8,913,753 | B2 | 12/2014 | Cohen et al. |
| 8,917,877 | B2 | 12/2014 | Haff et al. |
| 9,060,224 | B1* | 6/2015 | List .......................... G10L 15/08 |
| 9,117,449 | B2 | 8/2015 | Newman et al. |
| 9,210,545 | B2* | 12/2015 | Sabatelli ............... H04W 4/022 |
| 9,509,269 | B1* | 11/2016 | Rosenberg ............... H03G 3/32 |
| 9,683,884 | B2* | 6/2017 | Cohen ....................... H04S 1/00 |
| 9,921,803 | B2* | 3/2018 | Savolainen ............. G06F 3/167 |
| 2003/0135371 | A1 | 7/2003 | Chang et al. |
| 2005/0152562 | A1 | 7/2005 | Holmi et al. |
| 2006/0083388 | A1 | 4/2006 | Rothschild |
| 2007/0014420 | A1 | 1/2007 | Brown |
| 2008/0195396 | A1 | 8/2008 | Greene et al. |
| 2008/0205664 | A1 | 8/2008 | Kim et al. |
| 2008/0226087 | A1 | 9/2008 | Kinghorn |
| 2009/0016540 | A1 | 1/2009 | Heningsen Nielsen et al. |
| 2009/0097689 | A1 | 4/2009 | Prest et al. |
| 2010/0322455 | A1 | 12/2010 | Carlson |
| 2011/0069841 | A1 | 3/2011 | Angeloff et al. |
| 2011/0261978 | A1 | 10/2011 | Yamaguchi |
| 2012/0134507 | A1* | 5/2012 | Dimitriadis ............ H04R 1/326 |
| | | | 704/275 |
| 2012/0140955 | A1 | 6/2012 | Yasui |
| 2012/0215537 | A1 | 8/2012 | Igarashi |
| 2012/0223885 | A1 | 9/2012 | Perez |
| 2013/0028443 | A1 | 1/2013 | Pance et al. |
| 2013/0085757 | A1 | 4/2013 | Nakamura et al. |
| 2013/0094666 | A1 | 4/2013 | Haff et al. |
| 2013/0169884 | A1* | 7/2013 | Huang ..................... H03G 1/02 |
| | | | 348/E5.122 |
| 2013/0230174 | A1 | 9/2013 | Oliveras |
| 2013/0289994 | A1 | 10/2013 | Newman et al. |
| 2013/0304475 | A1 | 11/2013 | Gratke et al. |
| 2018/0204574 | A1 | 7/2018 | Hart et al. |
| 2018/0204749 | A1 | 7/2018 | Huska et al. |

OTHER PUBLICATIONS

Office Action for U.S. Appl. No. 13/627,890, mailed on Dec. 29, 2014, Gregory M. Hart, "Altering Audio to Improve Automatic Speech Recognition", 15 pages.

Office Action for U.S. Appl. No. 16/510,060, mailed on Dec. 9, 2021, Hart, "Altering Audio to Improve Automatic Speech Recognition", 6 pages.

Office action for U.S. Appl. No. 14/994,926, mailed on Feb. 22, 2017, Hart et al., "Altering Audio to Improve Automatic Speech Recognition", 8 pages.

Office action for U.S. Appl. No. 14/994,926, mailed on Mar. 30, 2016, Hart et al., "Altering Audio to Improve Automatic Speech Recognition", 14 pages.

Final Office Action for U.S. Appl. No. 13/627,890, mailed on Apr. 17, 2015, Gregory M. Hart, "Altering Audio to Improve Automatic Speech Recognition", 7 pages.

Office action for U.S. Appl. No. 14/994,926, mailed on Jun. 13, 2017, Hart et al., "Altering Audio to Improve Automatic Speech Recognition", 9 pages.

Office Action for U.S. Appl. No. 16/510,060, mailed Jul. 29, 2021, Hart, "Altering Audio to Improve Automatic Speech Recognition", 17 pages.

Office Action for U.S. Appl. No. 15/918,608, mailed on Sep. 14, 2018, Hart et al., "Altering Audio to Improve Automatic Speech Recognition", 14 pages.

Office action for U.S. Appl. No. 14/994,926, mailed on Sep. 19, 2016, Hart et al., "Altering Audio to Improve Automatic Speech Recognition", 19 pages.

Pinhanez, "The Everywhere Displays Projector: A Device to Create Ubiquitous Graphical Interfaces", IBM Thomas Watson Research Center, Ubicomp 2001, 18 pages.

\* cited by examiner

ALTERING AUDIO TO IMPROVE AUTOMATIC SPEECH RECOGNITION

CROSS-REFERENCE TO RELATED APPLICATIONS

This application is a continuation of and claims priority to U.S. application Ser. No. 16/510,060, filed Jul. 12, 2019, entitled "Altering Audio to Improve Automatic Speech Recognition," which is a continuation of and claims priority to U.S. application Ser. No. 15/918,608, filed Mar. 12, 2018, entitled "Altering Audio to Improve Automatic Speech Recognition," and which is now patented as U.S. Pat. No. 10,354,649, which application is a continuation of and claims priority to U.S. application Ser. No. 14/994,926, filed Jan. 13, 2016, entitled "Altering Audio to Improve Automatic Speech Recognition," and which is now patented as U.S. Pat. No. 9,916,830, which application is a continuation of and claims priority to U.S. application Ser. No. 13/627,890, filed on Sep. 26, 2012 entitled "Altering Audio to Improve Automatic Speech Recognition," and which is now patented as U.S. Pat. No. 9,251,787, which applications are hereby incorporated in their entireties by reference.

BACKGROUND

Homes are becoming more wired and connected with the proliferation of computing devices such as desktops, tablets, entertainment systems, and portable communication devices. As computing devices evolve, many different ways have been introduced to allow users to interact with these devices, such as through mechanical means (e.g., keyboards, mice, etc.), touch screens, motion, and gesture. Another way to interact with computing devices is through speech.

When interacting with a device through speech, a device may perform automatic speech recognition (ASR) on audio signals generated from sound captured within an environment for the purpose of identifying voice commands within the signals. However, the presence of audio in addition to a user's voice command (e.g., background noise, etc.) may make difficult the task of performing ASR on the audio signals.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
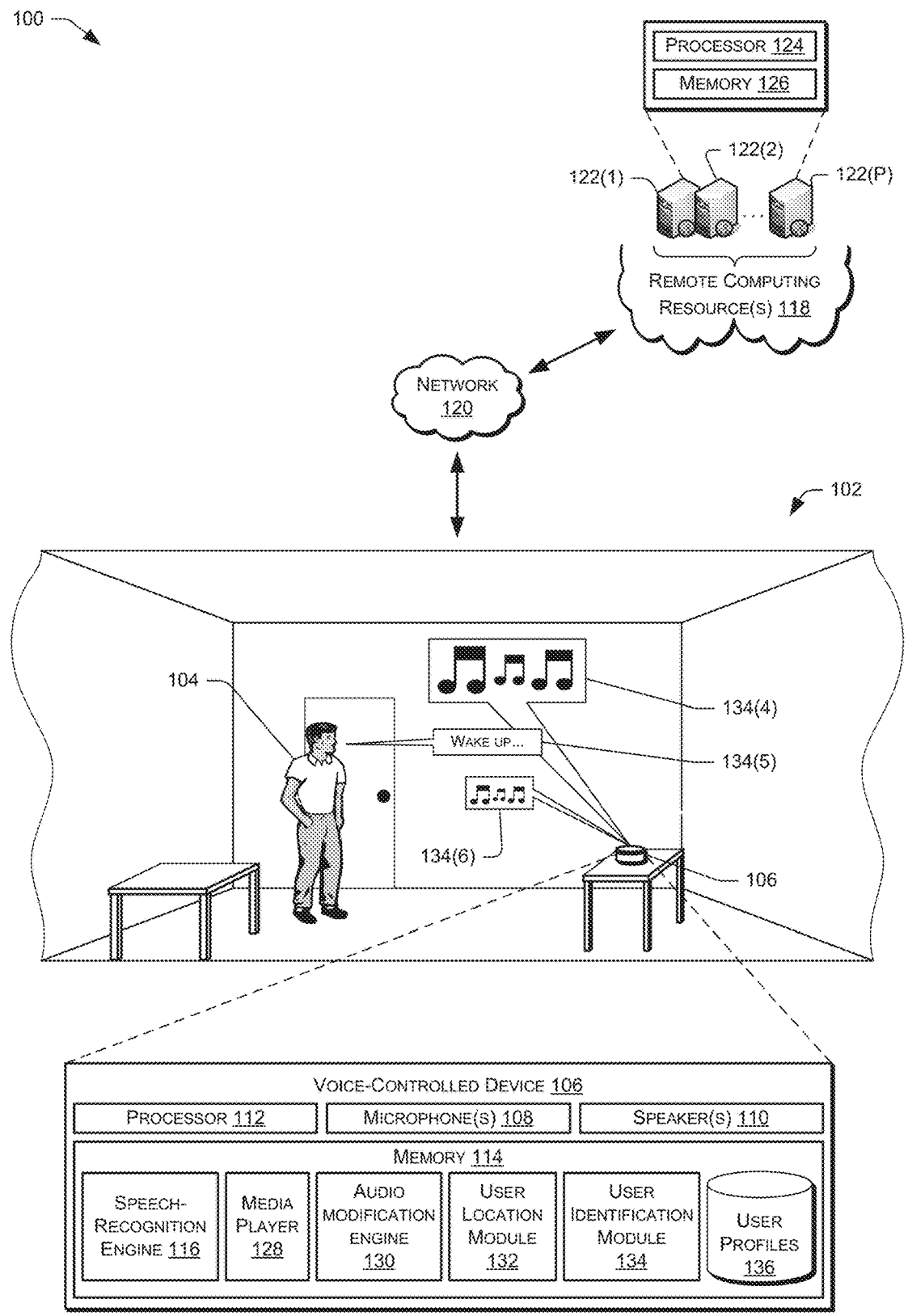
FIG. 1 shows an illustrative voice interaction computing architecture set in a home environment. The architecture includes a voice-controlled device physically situated in the home, along with a user who wishes to provide a command to the device. In this example, the user first speaks a predefined word or phrase to gain the attention of the device. In response to identifying this word or phrase, the device alters the output of audio that the device outputs in order to increase the accuracy of automatic speech recognition (ASR) performed on subsequent speech of the user captured by the device.

This disclosure describes, in part, techniques for altering audio being output by a voice-controlled device, or another device, to enable more accurate automatic speech recognition (ASR) by the voice-controlled device. For instance, a voice-controlled device may output audio within an environment using a speaker of the device. While outputting the audio, a microphone of the device may capture sound within the environment and may generate an audio signal based on the captured sound. The device may then analyze the audio signal to identify speech of a user within the signal, with the speech indicating that the user is going to provide a subsequent command to the device. That is, the user may speak a predefined word or words that, when recognized by the device, indicates to the device that the user is going to provide a voice command to the device.

In response to identifying the predefined word(s), the device may somehow alter the output of the audio for the purpose of reducing the amount of noise within subsequently captured sound. For instance, the device may alter a signal sent to the speaker to attenuate the audio, pause the audio (e.g., by temporarily ceasing to send the signal to the speaker), turn off one or more speakers of the device (e.g., by ceasing to send the signal to a speaker or by powering off the speaker), switch the signal sent to the speaker from a stereo signal to a mono signal or otherwise alter the output of the audio. By altering the output of the audio, an audio signal generated from the sound subsequently captured by the device will include less noise and, hence, will have a higher signal-to-noise ratio (SNR). This increased SNR increases the accuracy of speech recognition performed on the audio signal and, therefore, the device is more likely to decode a voice command from the user within the audio signal.

To illustrate, envision that a voice-controlled device is outputting a song on one or more speakers of the device. While outputting the audio, envision that a user speaks the predefined word(s) for signaling to the device that the user is about to provide a subsequent voice command to the device. In one example, the user may state the phrase "wake up", signaling to the device that the user is going to provide a command to the device.

One or more microphones of the device may capture sound and generate an audio signal that includes this phrase ("wake up"). The device may perform speech recognition on the audio signal and, upon decoding the predefined phrase, may alter the output of the audio. For instance, the device may attenuate the audio (i.e., turn down the volume). Thereafter, the user may state a command, such as a request to "remind me to buy bread from the store". Again, one or more microphones of the device may capture sound for the environment and may generate an audio signal based on the sound. Because the device has attenuated the audio, the speech of the user may represent a relatively large component of this generated signal as compared to the user's speech, had the audio remained at its previous volume. Stated otherwise, the user need not yell over the song in order to increase the component in the audio signal attributable to the user's speech.

The device may then perform automatic speech recognition on the audio signal and may identify the user's request to remind the user to buy bread from the store. The device may perform an operation corresponding to this request, such as adding bread to the user's grocery list.

In some instances, the device may take into account one or more characteristics of the received audio and/or the audio being output when deciding how to alter the output of the audio. For instance, the device may determine a distance between the user that is going to issue the voice command and the device (e.g., between the user and the microphones configured to capture the sound that includes the user's command). The device may determine the distance between a user and the device based on calculating a time-difference-of-arrival (TDOA) of the sound of the user speaking the predefined phrase at the different microphones of the device. In another example, the device may include a camera configured to perform depth-sensing techniques to determine the user's distance. Of course, while a few examples have been listed, the device may determine this information utilizing any other suitable technique.

After determining the distance, the device may determine how best to alter the output of the audio. For instance, the device may be configured to pause the audio or turn off one or more speakers if the user is at least a certain threshold distance away from the audio (e.g., may turn off the speaker closest to the user). In other examples, the device may determine, based on the distance, an amount to attenuate the audio, a number of speakers to turn off or the like. For instance, the device may attenuate the audio a great deal if the device determines that the user is far away from the device and may attenuate the amount a small amount (or not at all) if the user is near the device. The device may utilize any type of function when determining how much to attenuate the audio, such as a linear function, a stair-step function or the like. The device may alternatively attenuate the audio by a certain percentage based on the distance (e.g., attenuate to 80% of previous volume if user is between five and ten feet away, 70% if the user is between ten and fifteen feet, etc.).

In other instances, the device may determine a direction that the user is facing relative to the device (or the microphone(s) of the device) in order to determine how to attenuate or otherwise alter the audio. The device may determine this direction based on images captured by a camera, based on strength of the user's speech within audio signals generated by different microphones of the device, based on strength of the user's speech in different beams created using beam-forming techniques or using other techniques. In one example, the device may attenuate the audio more greatly if the user is faced away from the device's microphone(s) and may attenuate less if the user is directed toward the device's microphone(s).

In another example, the device may determine how to alter the output of the audio based the actual content being output (e.g., based on the class or type of the audio). For instance, if the device is outputting a song, then the device may be configured attenuate the audio. If the device is outputting an audio book, however, then the device may be configured to pause the output of the book while the user provides the voice command.

In yet another example, the device may reference an identity of the user when determining how to alter the output of the audio. The device may determine the user's identity using voice recognition techniques, facial recognition techniques (e.g., if the device includes a camera), based on the user authenticating with the device (e.g., speaking or typing in a user name and password at the device) or in any other suitable manner.

After identifying the user, the device may reference a user profile to determine a preference or setting associated with the user. For instance, a first user may have configured the device to pause output of the audio in response to the user speaking the predefined word(s). A second user, meanwhile, may have configured the device to attenuate the audio rather than pause output of the audio. In still another example, the device may reference a particular frequency range associated with an identified user and, thereafter, may attenuate that frequency range of the audio being output to facilitate speech recognition of the user's subsequent speech.

The devices and techniques described above and below may be implemented in a variety of different architectures and contexts. One non-limiting and illustrative implementation is described below.

FIG. 1 shows an illustrative voice interaction computing architecture 100 set in a home environment 102 that includes a user 104. The architecture 100 also includes an electronic voice-controlled device 106 with which the user 104 may interact. In the illustrated implementation, the voice-controlled device 106 is positioned on a table within a room of the home environment 102. In other implementations, it may be placed in any number of locations (e.g., ceiling, wall, in a lamp, beneath a table, under a chair, etc.). Further, more than one device 106 may be positioned in a single room, or one device may be used to accommodate user interactions from more than one room.

Generally, the voice-controlled device 106 has microphone unit that includes a microphone unit that includes at least one microphone 108 and a speaker unit that includes at least one speaker 110 to facilitate audio interactions with the user 104 and/or other users. In some instances, the voice-controlled device 106 is implemented without a haptic input component (e.g., keyboard, keypad, touch screen, joystick, control buttons, etc.) or a display. In certain implementations, a limited set of one or more haptic input components may be employed (e.g., a dedicated button to initiate a configuration, power on/off, etc.). Nonetheless, the primary and potentially only mode of user interaction with the electronic device 106 may be through voice input and audible output. One example implementation of the voice-controlled device 106 is provided below in more detail with reference to FIG. 2.

The microphone 108 of the voice-controlled device 106 detects audio from the environment 102, such as sounds uttered from the user 104, and generates a corresponding audio signal. As illustrated, the voice-controlled device 106 includes a processor 112 and memory 114, which stores or otherwise has access to a speech-recognition engine 116. As used herein, a processor may include multiple processors and/or a processor having multiple cores. The speech-recognition engine 116 performs speech recognition on audio captured by the microphone, such as utterances spoken by the user 104. The voice-controlled device 106 may perform certain actions in response to recognizing different speech from the user 104. The user may speak predefined commands (e.g., "Awake", "Sleep", etc.), or may use a more casual conversation style when interacting with the device 106 (e.g., "I'd like to go to a movie. Please tell me what's playing at the local cinema.").

In some instances, the voice-controlled device 106 may operate in conjunction with or may otherwise utilize computing resources 118 that are remote from the environment 102. For instance, the voice-controlled device 106 may couple to the remote computing resources 118 over a network 120. As illustrated, the remote computing resources 118 may be implemented as one or more servers 122 (1), 122

(2), . . . , 122 (P) and may, in some instances, form a portion of a network-accessible computing platform implemented as a computing infrastructure of processors, storage, software, data access, and so forth that is maintained and accessible via a network such as the Internet. The remote computing resources 118 do not require end-user knowledge of the physical location and configuration of the system that delivers the services. Common expressions associated for these remote computing devices 118 include "on-demand computing", "software as a service (SaaS)", "platform computing", "network-accessible platform", "cloud services", "data centers", and so forth.

The servers 122 (1)-(P) include a processor 124 and memory 126, which may store or otherwise have access to some or all of the components described with reference to the memory 114 of the voice-controlled device 106. For instance, the memory 126 may have access to and utilize the speech-recognition engine 116 for receiving audio signals from the device 106, recognizing speech and, potentially, causing performance of an action in response. In some examples, the voice-controlled device 106 may upload audio data to the remote computing resources 118 for processing, given that the remote computing resources 118 may have a computational capacity that far exceeds the computational capacity of the voice-controlled device 106. Therefore, the voice-controlled device 106 may utilize the speech-recognition engine 116 at the remote computing resources 118 for performing relatively complex analysis on audio captured from the environment 102.

Regardless of whether the speech recognition occurs locally or remotely from the environment 102, the voice-controlled device 106 may receive vocal input from the user 104 and the device 106 and/or the resources 118 may perform speech recognition to interpret a user's operational request or command. The requests may be for essentially type of operation, such as authentication, database inquires, requesting and consuming entertainment (e.g., gaming, finding and playing music, movies or other content, etc.), personal management (e.g., calendaring, note taking, etc.), online shopping, financial transactions, and so forth.

The voice-controlled device 106 may communicatively couple to the network 120 via wired technologies (e.g., wires, USB, fiber optic cable, etc.), wireless technologies (e.g., RF, cellular, satellite, Bluetooth, etc.), or other connection technologies. The network 120 is representative of any type of communication network, including data and/or voice network, and may be implemented using wired infrastructure (e.g., cable, CAT5, fiber optic cable, etc.), a wireless infrastructure (e.g., RF, cellular, microwave, satellite, Bluetooth, etc.), and/or other connection technologies.

As illustrated, the memory 114 of the voice-controlled device 106 also stores or otherwise has access to the speech recognition engine 116, a media player 128, an audio modification engine 130, a user location module 132, a user identification module 134 and one or more user profiles 136. The media player 128 may function to output any type of content on any type of output component of the device 106. For instance, the media player may output audio of a video or standalone audio via the speaker 110. For instance, the user 104 may interact (e.g., audibly) with the device 106 to instruct the media player 128 to cause output of a certain song or other audio file.

The audio modification engine 130, meanwhile, functions to modify the output of audio being output by the speaker 110 or a speaker of another device for the purpose of increasing efficacy of the speech recognition engine 116. For instance, in response to receiving an indication that the user 104 is going to provide a voice command to the device, the audio modification engine 130 may somehow modify the output of the audio to increase the accuracy of speech recognition performed on an audio signal generated from sound captured by the microphone 108. The engine 130 may modify output of the audio being output by the device, or audio being output by another device that the device 106 is able to interact with (e.g., wirelessly, via a wired connection, etc.).

As described above, the audio modification engine 130 may attenuate the audio, pause the audio, switch output of the audio from stereo to mono, attenuate a particular frequency range of the audio, turn off one or more speakers outputting the audio or may alter the output of the audio in any other way. Furthermore, the audio modification engine 130 may determine how or how much to alter the output the audio based on one or more of an array of characteristics, such as a distance between the user 104 and the device 106, a direction of the user 104 relative to the device 106 (e.g., which way the user 104 is facing relative to the device), the type or class of audio being output, the identity of the user 104 himself, a volume of the user's speech indicating that he is going to provide a subsequent voice command to the device or the like.

The user location module 132 may function to identify a location of the user within the environment 102, which may include the actual location of the user 104 in two- or three-space, a distance between the user 104 and the device 106, a direction of the user 104 relative to the device, or the like. The user location module 132 may determine this location information in any suitable manner. In some examples, the device 106 includes multiple microphones that each generates an audio signal based on sound that includes speech of the user (e.g., the user stating "wake up" to capture the device's attention). In these instances, the user location module 132 may utilize time-difference-of-arrival (TDOA) techniques to determine a distance of the user 104 from the device. That is, the user location module 132 may cross-correlate the times at which the different microphones received the audio to determine a location of the user 104 relative to the device 106 and, hence, a distance between the user 104 and the device 106.

In another example, the device 106 may include a camera that captures images of the environment 102. The user location module 132 may then analyze these images to identify a location of the user and, potentially, a distance of the user 104 to the device 106 or a direction of the user 104 relative to the device 106. Based on this location information, the audio modification engine 130 may determine how to modify output of the audio (e.g., whether to turn off a speaker, whether to instruct the media player 128 to attenuate the audio, etc.).

Next, the user identification module 134 may utilize one or more techniques to identify the user 104, which may be used by the audio modification module 130 to determine how to alter the output of the audio. In some instances, the user identification module 134 may work with the speech recognition engine 116 to determine a voice print of the user and, thereafter, may identify the user based on the voice print. In examples where the device 106 includes a camera, the user identification module 134 may utilize facial recognition techniques on images captured by the camera to identify the user 104. In still other examples, the device 106 may engage in a back-and-forth dialogue to identify and authenticate the user 104. Of course, while a few examples have been listed, the user identification module 134 may identify the user in any other suitable manner.

After identifying the user, the device 106 (e.g., the audio modification engine 130 or the user identification module 134) may reference a corresponding user profile 136 of the identified user to determine how to alter the output of the audio. For instance, one user may have configured the device 106 to pause the audio, while another user may have configured the device 106 to attenuate the audio. In other instances, the device 106 may itself determine how best to alter the audio based on one or more characteristics associated with the user (e.g., a general volume level or frequency of the user's speech, etc.). In one example, the device 106 may identify a particular frequency range associated with the identified user and may attenuate that frequency range in the audio being output.

Figure 2:
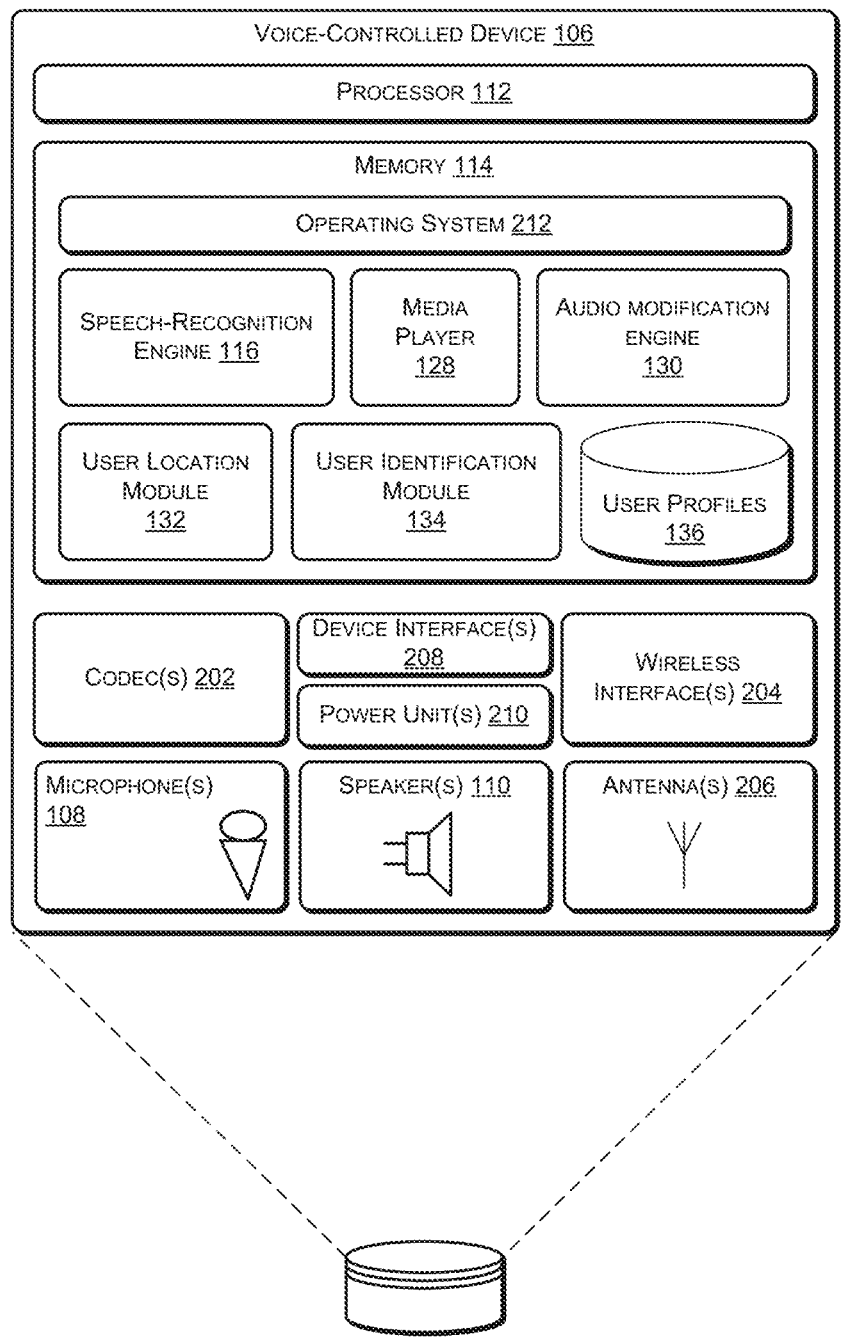
FIG. 2 shows a block diagram of selected functional components implemented in the voice-controlled device of FIG. 1.

FIG. 2 shows selected functional components of one implementation of the voice-controlled device 106 in more detail. Generally, the voice-controlled device 106 may be implemented as a standalone device that is relatively simple in terms of functional capabilities with limited input/output components, memory and processing capabilities. For instance, the voice-controlled device 106 does not have a keyboard, keypad, or other form of mechanical input in some implementations, nor does it have a display or touch screen to facilitate visual presentation and user touch input. Instead, the device 106 may be implemented with the ability to receive and output audio, a network interface (wireless or wire-based), power, and limited processing/memory capabilities.

In the illustrated implementation, the voice-controlled device 106 includes the processor 112 and memory 114. The memory 114 may include computer-readable storage media ("CRSM"), which may be any available physical media accessible by the processor 112 to execute instructions stored on the memory. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other medium which can be used to store the desired information and which can be accessed by the processor 112.

The voice-controlled device 106 includes a microphone unit that comprises one or more microphones 108 to receive audio input, such as user voice input. The device 106 also includes a speaker unit that includes one or more speakers 110 to output audio sounds. One or more codecs 202 are coupled to the microphone 108 and the speaker 110 to encode and/or decode the audio signals. The codec may convert audio data between analog and digital formats. A user may interact with the device 106 by speaking to it, and the microphone 108 captures sound and generates an audio signal that includes the user speech. The codec 202 encodes the user speech and transfers that audio data to other components. The device 106 can communicate back to the user by emitting audible statements through the speaker 110. In this manner, the user interacts with the voice-controlled device simply through speech, without use of a keyboard or display common to other types of devices.

In the illustrated example, the voice-controlled device 106 includes one or more wireless interfaces 204 coupled to one or more antennas 206 to facilitate a wireless connection to a network. The wireless interface 204 may implement one or more of various wireless technologies, such as wifi, Bluetooth, RF, and so on.

One or more device interfaces 208 (e.g., USB, broadband connection, etc.) may further be provided as part of the device 106 to facilitate a wired connection to a network, or a plug-in network device that communicates with other wireless networks. One or more power units 210 are further provided to distribute power to the various components on the device 106.

The voice-controlled device 106 is designed to support audio interactions with the user, in the form of receiving voice commands (e.g., words, phrase, sentences, etc.) from the user and outputting audible feedback to the user. Accordingly, in the illustrated implementation, there are no or few haptic input devices, such as navigation buttons, keypads, joysticks, keyboards, touch screens, and the like. Further there is no display for text or graphical output. In one implementation, the voice-controlled device 106 may include non-input control mechanisms, such as basic volume control button(s) for increasing/decreasing volume, as well as power and reset buttons. There may also be one or more simple light elements (e.g., LEDs around perimeter of a top portion of the device) to indicate a state such as, for example, when power is on or to indicate when a command is received. But, otherwise, the device 106 does not use or need to use any input devices or displays in some instances.

Several modules such as instruction, datastores, and so forth may be stored within the memory 114 and configured to execute on the processor 112. An operating system module 212 is configured to manage hardware and services (e.g., wireless unit, Codec, etc.) within and coupled to the device 106 for the benefit of other modules.

In addition, the memory 114 may include the speech-recognition engine 116, the media player 128, the audio modification engine 130, the user location module 132, the user identification module 134 and the user profiles 136. Also as discussed above, some or all of these engines, data stores, and components may reside additionally or alternatively at the remote computing resources 118.

Figure 3:
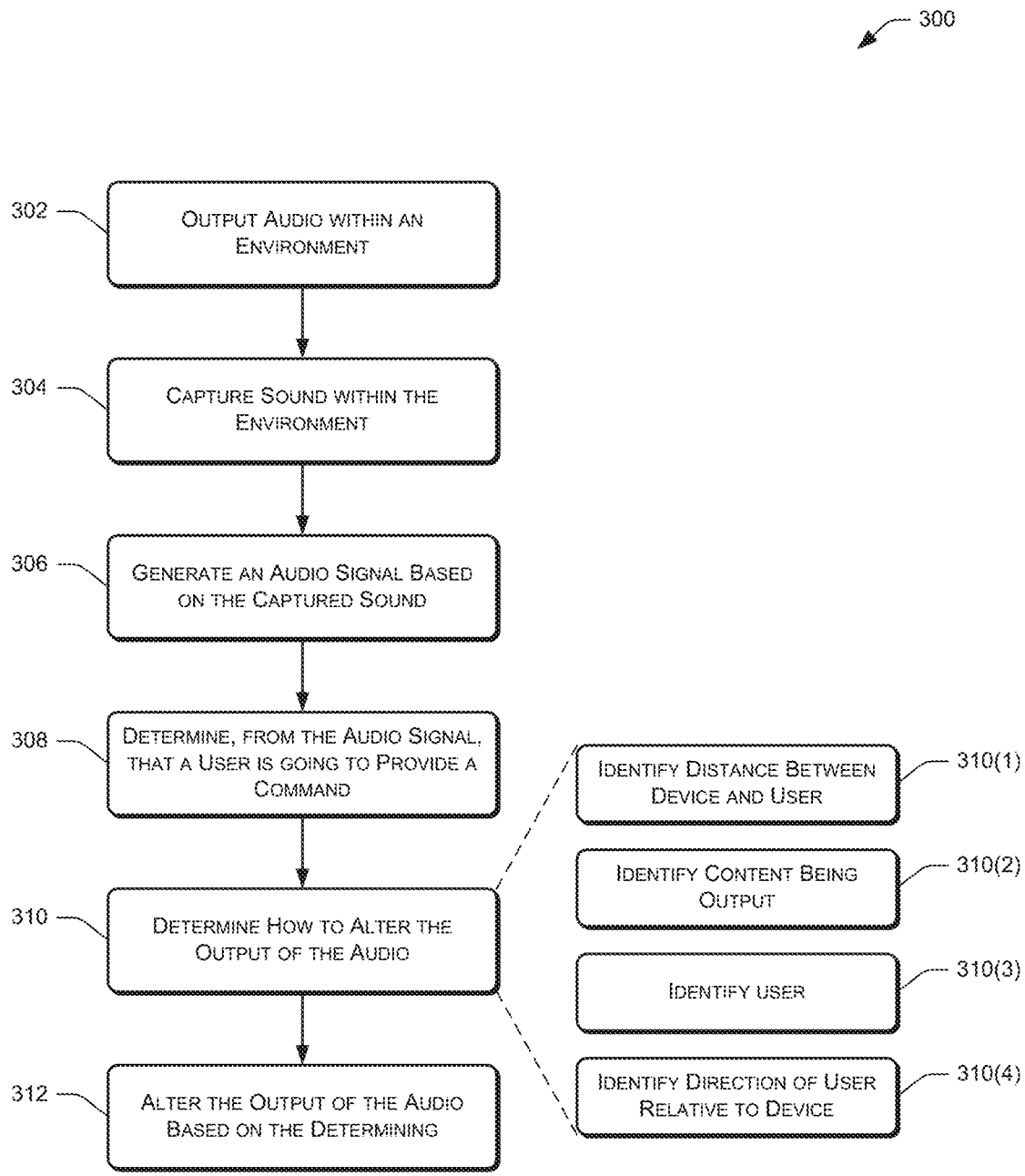
FIG. 3 depicts a flow diagram of an example process for attenuating audio being output by the voice-controlled device of FIG. 1 to increase the efficacy of ASR by the device.

FIG. 3 depicts a flow diagram of an example process 300 for attenuating audio being output by the voice-controlled device or by another device. The voice-controlled device 106, the remote computing resources 118, other computing devices or a combination thereof may perform some or all of the operations described below.

The process 300 is illustrated as a logical flow graph, each operation of which represents a sequence of operations that can be implemented in hardware, software, or a combination thereof. In the context of software, the operations represent computer-executable instructions stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer-readable storage media, which may include hard drives, floppy diskettes, optical disks, CD-ROMs, DVDs, read-only memories (ROMs), random access memories (RAMs), EPROMS, EEPROMs, flash memory, magnetic or optical cards, solid-state memory devices, or other types of storage media suitable for storing electronic instructions. In addition, in some embodiments the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process.

At 302, the process 300 outputs audio within an environment. For instance, the speaker 110 of the device 106 may output a song, an audio book, or another file that at least partly includes audio. At 304, the process 300 captures sound within the environment and, at 306, generates an audio signal based on the sound. For instance, a microphone 108 of the device 106 may capture the sound and generate the audio signal, with the sound include both the audio being output and additional audio (e.g., speech from a user, background noise, etc.)

At 308, the process 300 determines, from the audio signal, that the user is going to provide a command to a device. For instance, the speech recognition engine 116 of the device 106 may perform speech recognition on the audio signal to determine that the captured sound includes the user speaking a predefined word or words that, upon decoding by the device, indicates to the device that the user is going to provide a subsequent voice command. Of course, while the user signals this indication audibly in this example, in other examples the user may select a button on the device or may provide this indication in any other manner.

At 310, the process 300 determines how to alter the audio being output and, at 312, the process alters the output of the audio in the determined manner. For instance, the process 300 may first determine how to alter a signal sent to a speaker outputting the audio and, thereafter, may alter the signal accordingly. The process 300 may determine how to alter the output of the audio based on one or more characteristics of the audio signal, the audio being output or the like. As illustrated, the operation 310 may include one or more of sub-operations 310 (1), 310 (2), 310 (3), and 310 (4).

At 310 (1), the process 300 identifies a distance between the user and the device and determines how to alter the output of the audio based on this distance. For instance, the process 300 may determine to attenuate the audio more greatly the larger the distance between the user and the device. At 310 (2), meanwhile, the process 300 identifies the audio content that is being output and may reference this when determining how to alter its output. For instance, the process 300 may attenuate the audio if the audio is a song and may pause the audio if the audio is an audio book.

At 310 (3), the process 300 may identify the user and may use this identification to determine how to alter the output of the audio. For instance, the process 300 may reference preferences of the user, a frequency range of the user's voice or the like. At 310 (4), meanwhile, the process 300 may identify the direction of the user relative to the device to determine how to alter the output of the audio. For instance, if the user is determined to be facing away from a microphone of the device, then the process 300 may attenuate the audio more greatly than if the user is determined to be directed at the microphone.

In some instances, the process 300 may also determine how much to attenuate the audio based on a volume of a user's utterance, a volume of the audio being output by the device, or the like. For instance, the process 300 may alter the audio based on a ratio between a user's utterance intended to gain the attention of the device (e.g., "wake up") and the volume of the audio. The process 300 may attenuate the audio more if this ratio is relatively low than if the ratio is relatively great.

In another example, the process 300 may determine how much to attenuate the audio based on how confident the device is that the user was attempting to gain the device's attention. For instance, if device recognizes a user's utterance as the predefined phrase "wake up", the device may assign a confidence level to this utterance indicating how confident the device is that user did in fact state this phrase and, hence, is in fact attempting to awaken the device. In some instances, the process 300 may attenuate the audio inversely with this confidence score. For instance, the process 300 may attenuate the audio more greatly if the confidence score is relatively low. Of course, the opposite may be true in other implementations (i.e., the process 300 may attenuate the audio more greatly if the confidence score is relatively high).

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A device comprising:
   at least one speaker;
   at least one microphone;
   one or more processors; and
   computer-readable media storing computer-executable instructions that, when executed on the one or more processors, cause the device to perform operations, the operations comprising:
   storing, at the device, first data representing one or more predefined words indicating that a user is going to provide a subsequent command to the device;
   causing the at least one speaker to output first content at a first volume;
   receiving, while the at least one speaker outputs the first content at the first volume, a first input audio signal generated by the at least one microphone based at least in part on first sound from the user;
   performing speech processing on the first audio signal to generate second data indicating one or more spoken words of the user;
   determining, using the first data and the second data, that the one or more spoken words of the user correspond to the one or more predefined words indicating that the user is going to provide a subsequent command to the device;
   causing the at least one speaker to output the first content at a second volume that is less than the first volume;
   receiving, while the at least one speaker outputs the first content at the second volume, a second input audio signal representing a voice command generated by the at least one microphone based at least in part on second sound from the user;
   sending, based at least in part on the determining, third data based at least in part on the second input audio signal to one or more computing devices that are remote from an environment of the device;
   receiving, from the one or more computing devices and based at least in part on the voice command, output audio data representing an audible response to the voice command; and
   causing the at least one speaker to output the audible response represented in the output audio data.

2. The device of claim 1, wherein the computer-readable media further store computer-executable instructions that, when executed on the one or more processors, cause the device to perform an operation comprising causing, based at least in part on the voice command represented in the second input audio signal, the at least one speaker to output second content different from the first content.

3. The device of claim 1, wherein the voice command represented in the second input audio signal represents an instruction to add an item to a list associated with the user, and the computer-readable media further store computer-executable instructions that, when executed on the one or more processors, cause the device to perform an operation comprising causing, based at least in part on the voice command, the at least one speaker to output second content indicating that the item has been added to the list.

4. The device of claim 1, wherein the first content comprises video content and audio content, and wherein the causing the at least one speaker to output the first content at the second volume comprises causing the at least one speaker to output the audio content at the second volume.

5. The device of claim 1, wherein the first content comprises standalone audio content, and wherein the causing the at least one speaker to output the first content at the second volume comprises causing the at least one speaker to output the standalone audio content at the second volume.

6. The device of claim 1, wherein the causing the at least one speaker to output the first content at the second volume comprises causing the at least one speaker to output the first content at the second volume, the second volume comprises a predefined percentage of the first volume.

7. The device of claim 1, wherein the computer-readable media further store computer-executable instructions that, when executed on the one or more processors, cause the device to perform an operation comprising causing the at least one speaker to output the first content at the first volume subsequent to the at least one speaker outputting the audible response.

8. A method implemented at least in part by a device that includes at least one speaker and at least one microphone, the method comprising:
    storing, at the device, first data representing one or more predefined words indicating that a user is going to provide a subsequent command to the device;
    causing the at least one speaker to output first content at a first volume;
    receiving, while the at least one speaker outputs the first content at the first volume, a first input audio signal generated by the at least one microphone based at least in part on first sound from the user;
    performing speech processing on the first audio signal to generate second data indicating one or more spoken words of the user;
    determining, using the first data and the second data, that the one or more spoken words of the user correspond to the one or more predefined words indicating that the user is going to provide a subsequent command to the device;
    causing the at least one speaker to output the first content at a second volume that is less than the first volume;
    receiving, while the at least one speaker outputs the first content at the second volume, a second input audio signal representing a voice command generated by the at least one microphone based at least in part on second sound from the user;
    sending, based at least in part on the determining, third data based at least in part on the second input audio signal to one or more computing devices that are remote from an environment of the device;
    receiving, from the one or more computing devices and based at least in part on the voice command, output audio data representing an audible response to the voice command; and
    causing the at least one speaker to output the audible response represented in the output audio data.

9. The method of claim 8, further comprising causing, based at least in part on the voice command represented in the second input audio signal, the at least one speaker to output second content different from the first content.

10. The method of claim 8, wherein the voice command represented in the second input audio signal represents an instruction to add an item to a list associated with the user, and further comprising causing, based at least in part on the voice command, the at least one speaker to output second content indicating that the item has been added to the list.

11. The method of claim 8, wherein the first content comprises video content and audio content, and wherein the causing the at least one speaker to output the first content at the second volume comprises causing the at least one speaker to output the audio content at the second volume.

12. The method of claim 8, wherein the first content comprises standalone audio content, and wherein the causing the at least one speaker to output the first content at the second volume comprises causing the at least one speaker to output the standalone audio content at the second volume.

13. The method of claim 8, wherein the causing the at least one speaker to output the first content at the second volume comprises causing the at least one speaker to output the first content at the second volume, the second volume comprises a predefined percentage of the first volume.

14. The method of claim 8, further comprising causing the at least one speaker to output the first content at the first volume subsequent to the at least one speaker outputting the audible response.

15. One or more non-transitory computer-readable media storing computer-executable instructions that, when executed on one or more processors of a device that includes at least one speaker and at least one microphone, cause the device to perform operations, the operations comprising:
    storing, at the device, first data representing one or more predefined words indicating that a user is going to provide a subsequent command to the device;
    causing the at least one speaker to output first content at a first volume;
    receiving, while the at least one speaker outputs the first content at the first volume, a first input audio signal generated by the at least one microphone based at least in part on first sound from the user;
    performing speech processing on the first audio signal to generate second data indicating one or more spoken words of the user;
    determining, using the first data and the second data, that the one or more spoken words of the user correspond to the one or more predefined words indicating that the user is going to provide a subsequent command to the device;
    causing the at least one speaker to output the first content at a second volume that is less than the first volume;
    receiving, while the at least one speaker outputs the first content at the second volume, a second input audio signal representing a voice command generated by the at least one microphone based at least in part on second sound from the user;
    sending, based at least in part on the determining, third data based at least in part on the second input audio signal to one or more computing devices that are remote from an environment of the device;

receiving, from the one or more computing devices and based at least in part on the voice command, output audio data representing an audible response to the voice command; and causing the at least one speaker to output the audible response represented in the output audio data.

16. The one or more non-transitory computer-readable media of claim 15, further storing computer-executable instructions that, when executed on the one or more processors, cause the device to perform an operation comprising causing, based at least in part on the voice command represented in the second input audio signal, the at least one speaker to output second content different from the first content.

17. The one or more non-transitory computer-readable media of claim 15, wherein the voice command represented in the second input audio signal represents an instruction to add an item to a list associated with the user, and further storing computer-executable instructions that, when executed on the one or more processors, cause the device to perform an operation comprising causing, based at least in part on the voice command, the at least one speaker to output second content indicating that the item has been added to the list.

18. The one or more non-transitory computer-readable media of claim 15, wherein second input audio signal represents a voice command, and further storing computer-executable instructions that, when executed on the one or more processors, cause the device to perform operations comprising:

causing the at least one speaker to output the first content at the first volume subsequent to the at least one speaker outputting the audible response.

19. The one or more non-transitory computer-readable media of claim 15, wherein the first content comprises video content and audio content, and wherein the causing the at least one speaker to output the first content at the second volume comprises causing the at least one speaker to output the audio content at the second volume.

20. The one or more non-transitory computer-readable media of claim 15, wherein the first content comprises standalone audio content, and wherein the causing the at least one speaker to output the first content at the second volume comprises causing the at least one speaker to output the standalone audio content at the second volume.

21. The one or more non-transitory computer-readable media of claim 15, wherein second input audio signal represents a voice command, and further storing computer-executable instructions that, when executed on the one or more processors, cause the device to perform an operation comprising causing the at least one speaker to output the first content at the first volume subsequent to the at least one speaker outputting the audible response.

* * * * *